(12) United States Patent
Migia et al.

(10) Patent No.: US 10,001,506 B2
(45) Date of Patent: Jun. 19, 2018

(54) ADJUSTABLE TOOLING

(71) Applicant: D&V Electronics Ltd., Woodbridge (CA)

(72) Inventors: George Santiago Migia, Scarborough (CA); Eric Buss, Caledon (CA); Phillip Falk, Redford Twp, MI (US)

(73) Assignee: D&V Electronics, Ltd. (CA)

( * ) Notice: Subject to any disclaimer, the term of this patent is extended or adjusted under 35 U.S.C. 154(b) by 108 days.

(21) Appl. No.: 14/870,137

(22) Filed: Sep. 30, 2015

(65) Prior Publication Data
US 2017/0089949 A1 Mar. 30, 2017

(51) Int. Cl.
*G01M 15/00* (2006.01)
*G01R 1/04* (2006.01)
*G01R 31/34* (2006.01)

(52) U.S. Cl.
CPC ........... *G01R 1/0416* (2013.01); *G01R 31/34* (2013.01)

(58) Field of Classification Search
USPC ..................................................... 73/116.02
See application file for complete search history.

(56) References Cited

U.S. PATENT DOCUMENTS

| 4,198,042 A * | 4/1980 | Olson ..................... E01C 13/04 |
| | | 105/422 |
| 7,696,759 B2 | 4/2010 | Raichle et al. |
| 2006/0091597 A1* | 5/2006 | Opsahl .................... B25B 11/02 |
| | | 269/45 |
| 2007/0095132 A1* | 5/2007 | Krampitz .............. G01M 15/02 |
| | | 73/116.02 |
| 2013/0056611 A1* | 3/2013 | Kleifgen .................. B25B 5/14 |
| | | 248/670 |
| 2015/0083874 A1 | 3/2015 | Gill |

OTHER PUBLICATIONS

Author: Roger (Rog02), Title: TIG Torch Holder, Date: Mar. 5, 2010, Publisher: Welding Design and Fabrication, Forum, pp. total: 3.*

* cited by examiner

*Primary Examiner* — Lisa Caputo
*Assistant Examiner* — Roger Hernandez-Prewit
(74) *Attorney, Agent, or Firm* — Great Lakes Intellectual Property, PLLC.

(57) ABSTRACT

An adjustable tool configured to facilitate mounting an electromechanical device relative to a tester is contemplated. The adjustable tool may be operable to facilitate adjustably mounting a belt tensioner, pulley or other rotating element of the electromechanical device relative to a belt drive or other rotatable testing element included on the tester in a manner sufficient to enable adjusting tensioning and/or positioning therebetween.

15 Claims, 4 Drawing Sheets

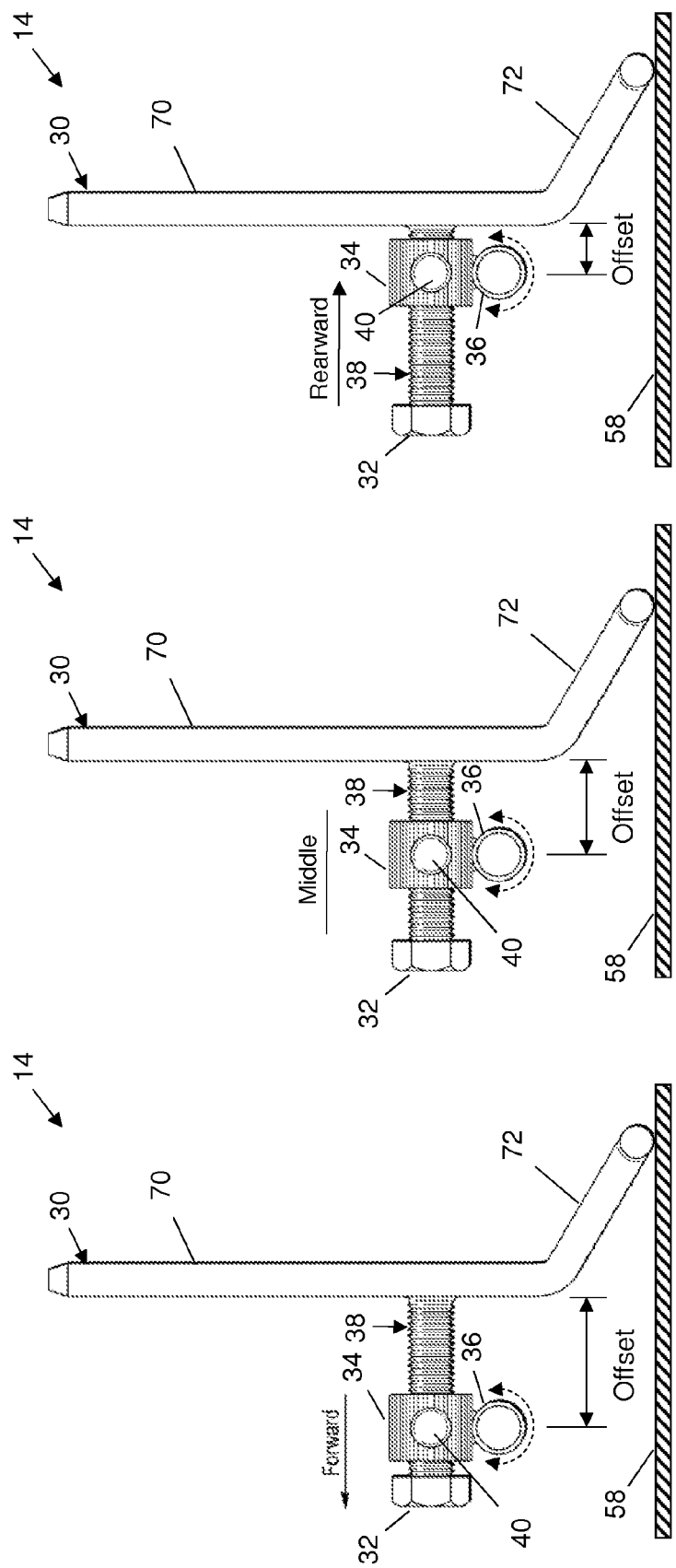

ADJUSTABLE TOOLING

TECHNICAL FIELD

The present invention relates to adjustable tooling, such as but not necessarily limited to adjustable tooling operable to facilitate adjustably mounting a pulley, belt tensioner, or other rotatable element of an electromechanical device relative to a belt drive or other rotatable testing element included on a tester to facilitate testing the electromechanical device.

BACKGROUND

Electromechanical devices may generally be referred to as a class or type of device relying on a combination of electrical and mechanical components, processes, operations, etc. to facilitate converting a mechanical movement into an electrical signal and/or to facilitate converting an electrical signal into a mechanical movement. Electromechanical devices, including but not limited to those utilized for electric vehicle (EV) and/or hybrid electric vehicle (HEV) motors, EV/HEV inverters, battery packs, integrated and belted start/stop starter/generators, alternators and/or their components, may periodically require laboratory, endurance and production testing. The associated testers and/or testing systems may be required to quickly and accurately test components of the electromechanical devices in production and remanufacturing environments to enable higher component throughput while at the same time reducing re-work costs and warranty claims; to perform development work in a full range of environmental and operating conditions to enable better performing products; and/or to prove out technology with laboratory-like precision to enable manufacturers to be earlier to market with emerging technologies.

The electromechanical testers may include fixtures or other support structures for mounting, positioning or otherwise orientating an electromechanical device under test (DUT) relative to drive mechanisms, electrical interfaces or other components required to test the operation thereof. While the present invention is not necessary limited to electromechanical devices, one non-limiting aspect of the present invention contemplates an adjustable tool disposed between the tester and an electromechanical DUT to facilitate adjustably mounting the electromechanical DUT relative to the electrical and/or mechanical components of the tester.

BRIEF DESCRIPTION OF THE DRAWINGS

FIGS. 4-6 illustrate movement of the adjustable tool in accordance with one non-limiting aspect of the present invention.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
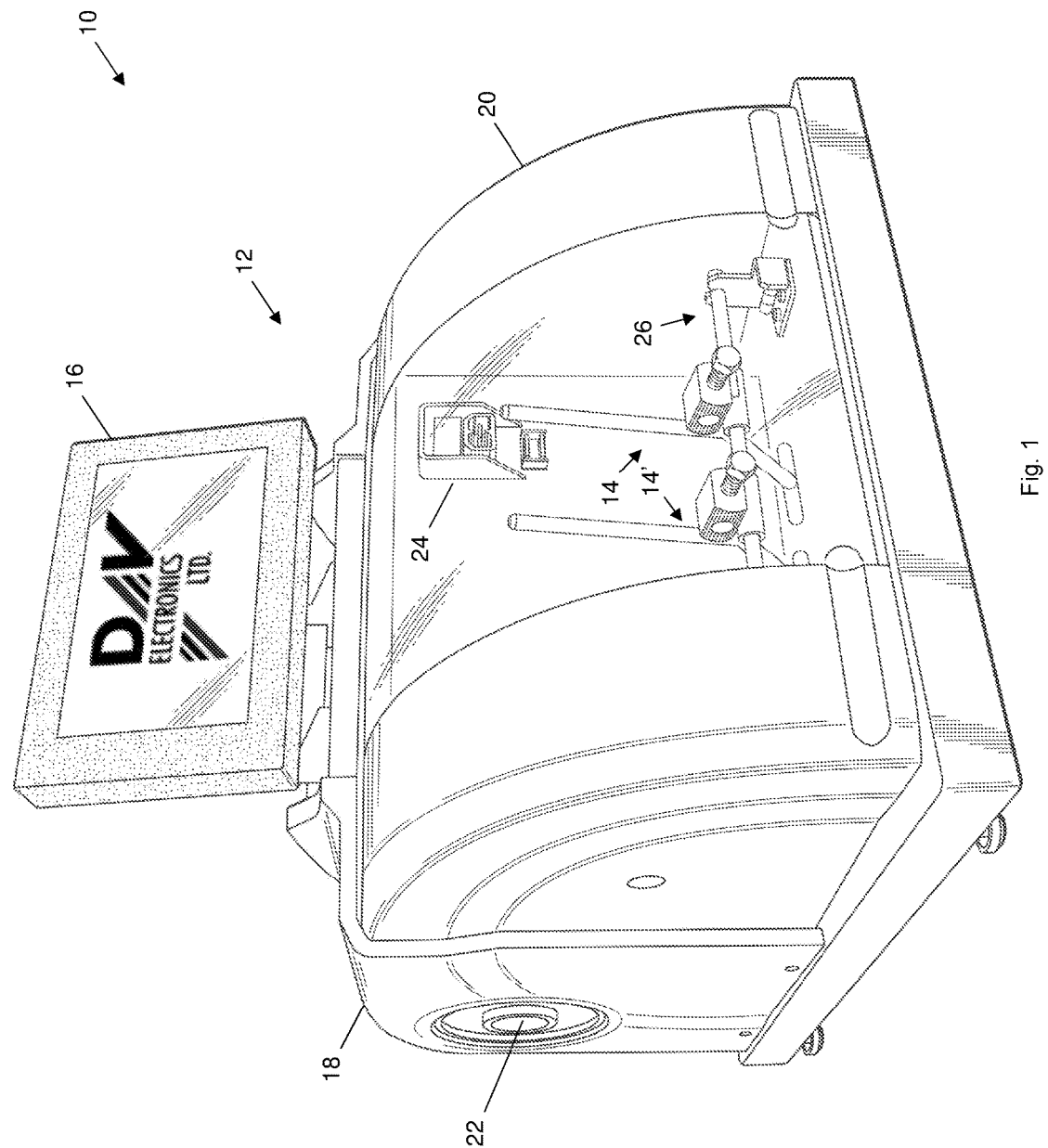
FIG. 1 illustrates a testing system in accordance with one non-limiting aspect of the present invention.

FIG. 1 illustrates a testing system 10 in accordance with one non-limiting aspect of the present invention. The testing system 10 is shown to include a tester 12 and one or more adjustable tools 14 configured to facilitate adjustable mounting a device under test (DUT) (not shown). The tester 12 may include various fixtures, supports, components, etc. to facilitate testing the mechanical and/or electrical operation of the DUT and is shown for exemplary purposes to include a touchscreen/display 16, a housing 18, a retractable lid 20, a mechanical component 22, an electrical component 24 and a fixture 26. The tester 12 may be a multipurpose, computerized tester for testing operation of alternators, starters, motors or virtually any other electromechanical device, such as but not necessarily limited to the JBT-1 Universal Tester developed by D&V Electronics. The adjustable tools 14 may be configured to facilitate adjustable positioning of the electrical/mechanical components of the DUT relative to the electrical/mechanical components 22, 24, 26 of the tester so as to enable the tester to be used with DUTs of multiple sizes and shapes and/or those having varying mounting brackets or structural attachments.

Figure 2:
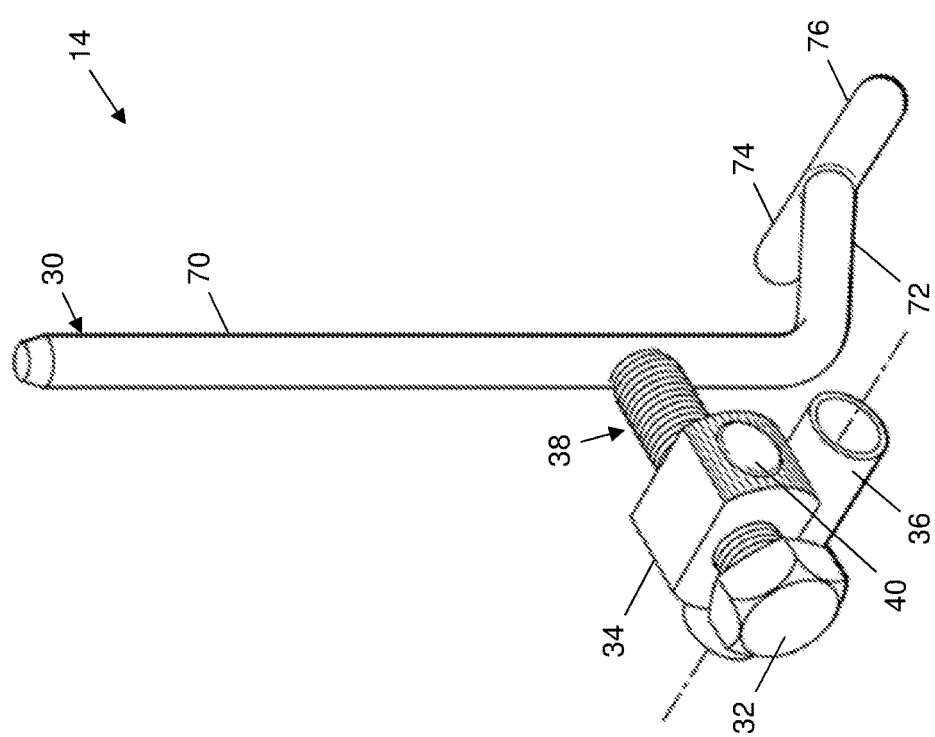
FIG. 2 illustrates a perspective view of an adjustable tool in accordance with one non-limiting aspect of the present invention.

FIG. 2 illustrates a perspective view of the adjustable tool 14 in accordance with one non-limiting aspect of the present invention. The tool 14 is shown to include a first member 30, a second member 32, a third member 34 and a fourth member 36, which may be hereinafter respectively referred to for exemplary purposes as a tine 30, a bolt 32, a nut 34 and a base 36. The base 36 may be shaped or otherwise configured to facilitate attachment to the fixture 26 and affixed to the nut 34 with a weld or other immovable attachment, such as by being T-shaped to fit within T-slots of an elongated member 54 (see FIG. 3) or to fit within other suitable fixturing used in place of the elongated member 54. The tine 30 may be shaped or otherwise configured to facilitate supporting the DUT and affixed to the bolt 32 with a weld or other immovable attachment. The bolt 32 may include a plurality of engagement elements 38 along a bolt body and operable with an engagement mechanism 40 of the nut 34 to facilitate retaining the nut 34 at a plurality of positions thereon. The engagement mechanism 40 may engage one or more the plurality of engagement elements 38 to secure the nut at one or more of the plurality of positions or otherwise selectively prevent its movement between the plurality of positions so as to facilitate adjustably mounting the DUT to the fixture.

Figure 3:
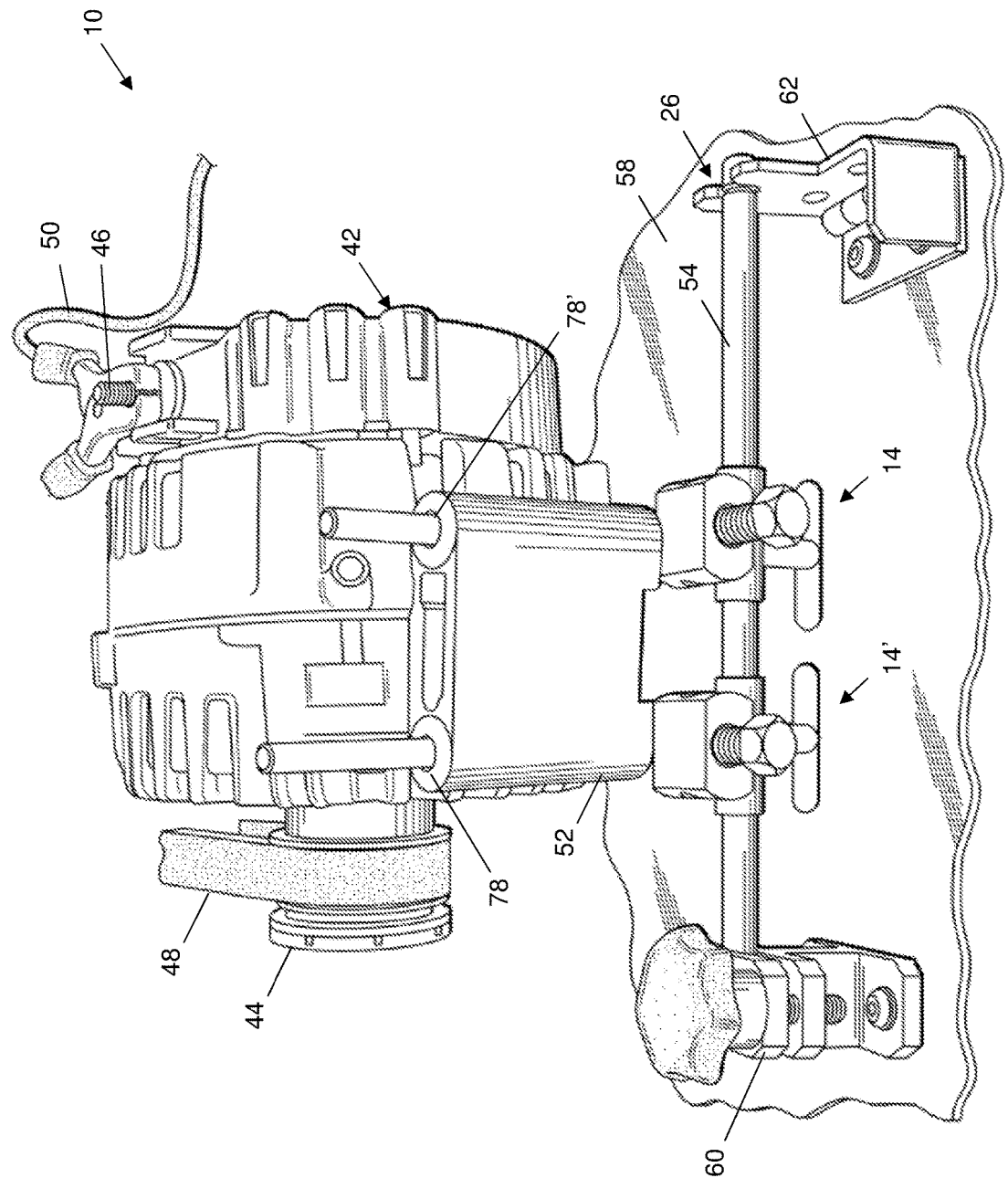

FIG. 3 illustrates a cut-away view of the system 10 showing use of two adjustable tools 14 to facilitate adjustably mounting an electromechanical device (DUT) 42 in accordance with one non-limiting aspect of the present invention. The DUT 42 may be of the type where the mechanical component is a belt tensioner, pulley or other axially rotating component 44 and the electrical component is an electrical connector or terminal 46, such as those commonly employed on an alternator, a starter and/or a motor. The tester 12 may be correspondingly configured to test the operation thereof with the mechanical component 22 being configured as a belt drive having a belt 48 operable to drive or be driven by the pulley 44 and the electrical component 24 being an electrical interface having a clamp/cable 50 operable to exchange electrical signals with the terminal 46. The DUT 42 may include a tangential or radial mount 52, i.e., a mount perpendicular or otherwise transverse to the rotational axis of the pulley 44, to facilitate securing it when operational.

The adjustable mounting tool 14 contemplated by the present invention may interact with the mount 52 to facilitate adjustable mounting the DUT 42 to the fixture 26 in order to enable proper alignment of the belt 48 with the pulley 44, such as to position the belt 48 to evenly rotate about the pulley 44 with proper tension, without wobbling and/or in a manner otherwise representative of its use in the field. The tester 12, particularly if a universal tester, may be configured to test electromechanical devices of various sizes and shapes, e.g., those having pulleys 44 of varying sizes and/or varying spatial relationships with the mount 52. Rather than having different mounting tools for each variation of the electromechanical device, the adjustable tool 14 contemplated by the present invention may provide a universal interconnection with the fixture 26 sufficient to compensate for the electromechanical device variabilities. The universal interconnection may be characterized by the mounting tool 14 being laterally moveable along an elongated member 54 of the fixture 26 and transversely moveable therefrom along an axial length of the bolt body.

Once the DUT 42 is properly aligned with the adjustable tool 14, the tester 12 may include a testing algorithm or program stored in a non-transitory computer-readable medium having a plurality of non-transitory instructions operable with a processor to facilitate a testing sequence. The testing sequence may be generally include automatically adjusting the belt 48 to provide the appropriate tension on the pulley 44 and thereafter generating electrical signals sufficient for controlling the pulley 44 to drive or be driven by the belt drive 22 whereby resulting electrical signaling may be assessed to determine performance of the electromechanical device. The testing sequence may require the DUT 42 and/or the tester 12 to include additional sensors (not shown) or other components to facilitate monitoring or otherwise assessing performance of the DUT 42, which may vary depending on whether the DUT 42 is operable to drive or be driven by the belt drive 22. The mechanical and electrical components of the tester 12 and the DUT 42 described herein are provided merely for exemplary non-limiting purposes as any number of additional features may be required in order to perform the testing.

The fixture 26 is shown for exemplary purposes with the elongated member 54 being a predominately circular bar 54 raised above a supporting surface 58 and secured at distal ends with corresponding attachment mechanisms 60, 62. The elongated member 54 is shown to be circular in order to demonstrate one non-limiting aspect of the present invention where the base 36 is correspondingly shaped as a tube 36 and operable to freely rotate about the elongated member 54 and to freely slide along a substantial entirety thereof. The elongated member 54 may be shaped differently and/or include features sufficient to prevent rotation of the base 36 and/or to securely position the base 36 at selectable portions or sections of the elongated member 54. The elongated member 54 and/or the base 30 may be flat, square, oval, star, etc. and/or the elongated member 54 may have a discontinuous outer surface with engagement mechanisms/elements, threads, reliefs, recesses or other constructs sufficient to retain, engage or otherwise securely position the base 36 at selectable intervals, optionally without enabling the base to rotate.

FIGS. 4-6 illustrate transverse movement of the adjustable tool 14 in accordance with one non-limiting aspect of the present invention. The transverse movement may be generally perpendicular to the lateral movement of the base 36 along the elongated member 54 whereby the nut 34 is retainable at one or more positions along the bolt 32 corresponding with one or more of the engagement members 38, which is shown for exemplary purposes to correspond with a forward position (FIG. 4), a middle position (FIG. 5) and a rearward position (FIG. 6). The engagement mechanism 40 may be a spring-loaded or biased feature operable between an engaged position and a disengaged position. The engage position may be configured to engage a tooth, pawl or other feature (not shown) with one or more of the engagement elements 38 to prevent the nut 34 from moving therefrom. The disengaged position may be configured to withdraw or otherwise disengage the engagement mechanism 40 from the engagement elements 38 whereupon the nut 34 may slide to any position along the bolt 32. A spring or biasing member (not shown) may be configured to normally engage one or more of the engagement elements 38 in the absence of sufficient force pressing on the engagement mechanism 40.

The engagement elements 38 are shown as a plurality of interconnecting threads 38 shaped on along a substantial entirety of an outer diameter of the bolt body between a bolt head and a connection point to the tine 30. The engagement mechanism 40 may be disengaged to enable the nut 34 to slide along the bolt body without being rotated so as to enable the mounting tool 14 to adjust an offset of the tine 30 relative to the fixture 26 without having to remove the nut 34 from the elongated member 54. The use of threads 38 to facilitate positioning the nut 34 is shown for exemplary non-limiting purposes as the present invention fully contemplates the use of other engagement elements 38 interacting with the engagement mechanism 40, such as but not necessarily limited to apertures, recesses, detents, saw-tooth pattern, knurl, etc. engagement elements 38 interacting with a correspondingly or suitably configured engagement mechanism 40. The bolt head may be included at a first distal end of the bolt 32 and have an outer diameter larger than both of an outer diameter of the bolt body and an inner diameter of the nut 34 to limit movement along the bolt body between the bolt head and the tine 30. The ability to position the nut 34 at the forward, middle, rearward or other position therebetween may be beneficial in enabling an operator to set an initial tension between the belt 48 and the pulley 44, e.g., the rearward position may set a tension slightly greater than the middle position and the middle position may set a tension slightly greater than the forward position.

The nut 34 may include a width correspondingly shorter than an axial length of the bolt body to enable the nut 34 to travel thereon and thereafter be secured at a desired position. A top and bottom side of the nut are shown to be generally planar so to enable the top surface to provide a flat, supporting surface for the mount 52 (see also FIG. 3) and the bottom surface to provide a flat surface maximizing area for facilitating attachment to the base 36. An outer portion of the nut between the top and bottom surfaces is shown to be generally circular for exemplary purposes and may be shaped otherwise depending on design considerations and ease of use. The tube 36 may include an inner diameter slightly larger than an outer diameter of the bar 54 such that the nut 34 is free to facilitate rotation about the fixture 26 until either an upper, distal end or a lower, distal end of the tine 30 engages the supporting surface 58. The ability of the tube 36 to freely rotate about the elongated member 54 may enable the tine 30 to rotate against the support surface 58 and distribute at least part of a load from the DUT 42 thereto.

The tine 30 is shown to be characteristically T-shaped (see also FIG. 2) with a central body having an upper section 70 generally vertical and a lower section 72 angled therefrom. The angular positioning of the lower section 72 may be more beneficial than a coplanar or straight lower section 72 in facilitating upright or vertical positioning of the upper section 70. First and second branches 74, 76 may extend laterally from the distal end of the lower section 72 or a singular bar or stop to resist torque or other rotational forces being translated through the bolt 32 to the nut 34 and/or base 36. The upper section 70 may be shaped for attachment to the mount 52, such as in the illustrated manner through journaling within an aperture 78, which is shown for exemplary non-limiting purposes with the upper portion being generally circular in shape and sized for receipt within the generally circular aperture 78 of the mount 52. The first and second branches 74, 76 may be shaped and/or sized to be slightly greater than a diameter of the aperture 78 so as to ensure only the upper section 70 may be inserted therein.

The tine 30 is shown to be characteristically T-shaped and predominantly circular for exemplary non-limiting purposes as the present invention fully contemplates the tine 30 being straight or otherwise shaped to facilitate the adjustable mounting capabilities contemplated herein. The upper section 70 may be shaped differently to include recesses, tabs, detents or other features configured to facilitate its attachment to the mount 52 or other supporting infrastructure of the DUT 42. The upper section may also be shaped to include threads or other suitable features to enable a nut or other clamping element to press against a top of the aperture 78 for purposes of enhancing securement to the fixture 26. The lower section 72 may also be shaped differently to omit the lateral branches 74, 76 and/or to engage a surface, recess or other element on the DUT 42 instead of the supporting surface 58, i.e., the lower section 72 may be shaped to facilitate supporting the DUT 42 without pressing against the supporting surface 58 such that an entirety of the DUT load is supported on the fixture 26. FIG. 3 illustrates a height of the tine 30 included on the leftward adjustable tool 14' being slightly greater than a height of the tine 30 included on the rightward adjustable tool 14 in order to demonstrate one capability of the present invention to utilize tines 30 of varying height to facilitate mounting variously sized mounts 52. The varying tine heights may also be beneficial in facilitating placement of the DUT 42 therein, such as to enable an angled entry or rocking motion where one aperture 78 is placed over the longer tool 14' prior to the shorter tool 14 engaging the neighboring aperture 78'.

While the DUT 42 is shown in FIG. 2 to be supported with two adjustable tools 14, the present invention fully contemplates its use and application in facilitating support of DUTs 42 with one and/or three or more adjustable tools 14. The use of the nut 34 and the bolt 32 is provided for exemplary purposes to demonstrate one manner of using off-the-shelf or commonly available components to facilitate fabricating the adjustable tool 14, i.e., by placing the nut 34 over the bolt 32 and then welding or otherwise attaching the bolt 32 to the tine 30. The nut 34 is described has having a biased engagement mechanism 40 as the nut 34 is contemplated to lack threading operable with the engagement elements 38 in order to enable its movement without having to be rotated as it may be difficult to rotate the nut 34 once affixed to the tine 30 and attached via the base 36 to the elongated member 54. The nut 34 may include threads or other engaging features customarily associated therewith without deviating from the scope and contemplation of the present invention. The bolt 32 is shown to include the customarily associated hex head and threads but may configured without such features or different features if sufficient to facilitate the operations contemplated herein.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A tool for adjustably mounting an object to a fixture, the tool comprising:
   a tine shaped to support the object;
   a bolt affixed to the tine having a plurality of engagement elements spaced apart along a bolt body;
   a nut configured to be selectively retained at a plurality of positions along the bolt body corresponding with one or more of the plurality of engagement elements;
   a base configured to secure the nut to the fixture such that movement of the nut between the plurality of positions correspondingly adjusts mounting of the bolt relative to the fixture and in turn the object supported on the tine, thereby adjustably mounting the object to the fixture;
   wherein the plurality of engagement elements are spaced apart along an axial length of the bolt body, the axial length being greater than a width of the nut such that the nut can be positioned at a middle position and moved therefrom toward at least a forward position and a rearward position, each of the middle, forward and rearward positions being a corresponding one of the plurality of positions; and
   wherein the base is immovable affixed to the nut such that an offset measured along the axial length of the bolt body between the tine and the fixture increases when the nut moves from the middle position toward the forward position and decreases when the nut moves from the middle position toward the rearward position.

2. A tool for adjustably mounting an object to a fixture, the tool comprising:
   a tine shaped to support the object;
   a bolt affixed to the tine having a plurality of engagement elements spaced apart along a bolt body;
   a nut configured to be selectively retained at a plurality of positions along the bolt body corresponding with one or more of the plurality of engagement elements;
   a base configured to secure the nut to the fixture such that movement of the nut between the plurality of positions correspondingly adjusts mounting of the bolt relative to the fixture and in turn the object supported on the tine, thereby adjustably mounting the object to the fixture;
   wherein a first distal end of the bolt includes a head having an outer diameter larger than both of an outer diameter of the bolt body and an inner diameter of the nut and wherein a second distal end of the bolt is permanently affixed to the tine, thereby limiting the nut to movement along the bolt body between the head and the tine;
   wherein the plurality of engagement elements are interconnecting radial threads shaped onto the outer diameter of the bolt body; and
   wherein the nut includes an engagement mechanism operable between an engaged position and a disengaged position, the disengaged position disengaging the engagement mechanism from the threads so as to allow the nut to move along the bolt body and the engaged position engaging the engagement mechanism with one or more of the threads so as to secure the nut from moving thereafter along the bolt body.

3. The tool of claim 2 wherein the engagement mechanism when in the disengaged position permits the nut to be moved from a first position of the plurality of positions to a second position of the plurality of positions offset from the first position without being rotated.

4. A tool for adjustably mounting an object to a fixture, the tool comprising:
a tine shaped to support the object;
a bolt affixed to the tine having a plurality of engagement elements spaced apart along a bolt body;
a nut configured to be selectively retained at a plurality of positions along the bolt body corresponding with one or more of the plurality of engagement elements;
a base configured to secure the nut to the fixture such that movement of the nut between the plurality of positions correspondingly adjusts mounting of the bolt relative to the fixture and in turn the object supported on the tine, thereby adjustably mounting the object to the fixture;
wherein the tine is shaped to include an elongated central portion having first and second branches extending therefrom so as to be characteristically T-shaped; and
wherein a lower section of the central portion is angled relative to a longer, upper section of the central portion and wherein the first and second branches extend from a bottom, distal end of the lower section in opposite directions.

5. The tool of claim 4 wherein the affixation of the base to the nut orientates the bolt to be characteristically perpendicular to an elongated axis of the fixture and wherein the first and second branches extend from the central portion so as to be characteristically parallel to the elongated axis of the fixture.

6. The tool of claim 5 wherein the fixture is a predominately circular bar raised above a support surface and the base is shaped as a tube having an inner diameter slightly larger than an outer diameter of the bar such that the nut is free to slide along and to rotate about the fixture until either of the first and second branches or an upper, distal end of the upper section abut the support surface.

7. A system for testing an electromechanical device of the type having a radial mounting bracket with an aperture generally perpendicular to an axis of a pulley, the system comprising:
a tester including:
i) a belt drive with a belt operable to drive and/or be driven by the pulley to facilitate the testing;
ii) an interface operable to exchange electrical signals with the electromechanical device to facilitate the testing; and
iii) a fixture having an elongated member offset from a support surface; and
a tool for adjustable mounting the electromechanical device to the fixture, the tool including:
i) a tine having an upper portion shaped for receipt within the aperture and a lower portion shaped to rest against the support surface;
ii) a bolt affixed to the tine having an elongated bolt body;
iii) a nut configured to be selectively positioned along the bolt body at at least a first position and a second position; and iv) a base configured to secure the nut to the elongated member such that the tine is positioned at a first offset from the elongated member when the nut is in the first position and at a second offset from the elongated member when the nut is in the second position, whereby the first offset produces a first tension between the belt and the pulley and the second offset produces a second tension between the belt and the pulley different from the first tension.

8. The system of claim 7 wherein:
the bolt includes a plurality of engagement elements spaced apart along the bolt body, including a first engagement element at the first position and a second engagement element at the second position; and
the nut includes an engagement mechanism operable to:
i) engage the first engagement element to prevent movement therefrom;
ii) disengage the first engagement element to enable movement therefrom toward the second engagement element; and
iii) engage the second engagement element to prevent movement therefrom.

9. The system of claim 8 wherein the engagement element is operable to engage the first engagement element and thereafter disengage the first engagement element to enable the nut to move to the second engagement element without requiring the nut to be rotated.

10. The system of claim 9 wherein the plurality of engagement elements are interconnecting threads extending in an uninterrupted manner from at least the first engagement element to the second engagement element such that two or more threads are included between a first thread corresponding with the first engagement element and a second thread corresponding with the second engagement element.

11. The system of claim 7 wherein the lower portion of the tine includes at least one branch longer than a width of the aperture extending laterally from the lower portion.

12. A tool configured to adjustably position a pulley included on an electromechanical device relative to a belt drive included on a tester of the type having an elongate fixture disposed above a support surface, the tool comprising:
a first member having an upper portion shaped for engaging the electromechanical device and a lower portion shaped for engaging the support surface;
a second member extending from and being attached to the first member;
a third member configured to be slidably re-positioned and retained along the second member at at least a first position and a second position; and
a fourth member configured to secure the third member to the elongated fixture such that the first member is positioned at a first offset from the elongated fixture when then third member is in the first position and at a second offset from the elongated fixture when the third member is in the second position, whereby the first offset produces a first tension between the belt drive and the pulley and the second offset produces a second tension between the belt drive and the pulley, the second tension being different from the first tension.

13. The tool of claim 12 wherein:
the second member extends perpendicularly from the upper portion and includes a plurality of threads, including a first thread coinciding with the first position and a second thread coinciding with the second position; and the third member includes an engagement mechanism operable to:
i) engage the first thread to prevent movement therefrom;
ii) disengage the first thread to enable movement therefrom toward the second thread without requiring rotation of the third member; and
iii) engage the second thread to prevent movement therefrom.

14. The tool of claim 12 wherein the first member is characteristically T-shaped with the upper portion being shaped to fit within an aperture of the electromechanical device and the lower portion being angled relative to the upper portion and including first and second branches, the first and second branches being at a distal end of the lower portion and extending outwardly from a central body of the lower portion in a direction generally parallel to an axis of rotation for the pulley.

15. The tool of claim 12 wherein the fourth member is shaped as a tube having an inner diameter slightly larger than an outer diameter of the elongated fixture such that the third member is free to at least partially slide along and to at least partially rotate thereonabout the elongated fixture.

* * * * *